United States Patent
Jang et al.

(10) Patent No.: US 6,241,817 B1
(45) Date of Patent: *Jun. 5, 2001

(54) METHOD FOR CRYSTALLIZING AMORPHOUS LAYER

(75) Inventors: Jin Jang, 102-1103, Hyundae Apt. 53, Jamwon-dong, Seocho-ku, Seoul; Soo-Young Yoon, Daejeon; Jae-Young Oh, Jeju-shi, all of (KR)

(73) Assignees: Jin Jang; LG Electronics Inc., both of Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/083,109

(22) Filed: May 22, 1998

(30) Foreign Application Priority Data

May 24, 1997 (KR) .................................. 97-20527
Jun. 4, 1997 (KR) .................................. 97-22736
Feb. 20, 1998 (KR) .................................. 98-5291

(51) Int. Cl.$^7$ ............................................ C30B 1/06
(52) U.S. Cl. ............................. 117/8; 117/3; 438/162; 438/166; 438/186
(58) Field of Search .................... 438/162, 166, 438/486; 117/8, 3

(56) References Cited

U.S. PATENT DOCUMENTS 5,585,291 * 12/1996 Ohtani et al. ................... 438/486
5,797,999 * 8/1998 Sannomiya et al. ............. 136/258
5,869,363 * 2/1999 Yamazaki et al. ............... 438/166
5,897,347 * 4/1999 Yamazaki et al. ............... 438/166

OTHER PUBLICATIONS

Yoon, Soo Young, et al., "Low temperature metal induced crystallization of amorphous silicon using a Ni solution", J. Applied Physics vol. 82 No. 11:5865–67, Dec. 1997.*
H. Kuriyama et al., "Improving the Uniformity of Poly–Si Films Using a New Excimer Laser Annealing Method for Giant–Microelectronics" Jpn. J. Appl. Phys vol. 31, pp. 4550–4554, Dec. 1992.
M.S. Haque et al., "Aluminum–induced crystallization and counter–doping of phosphorous doped hydrogenated amorphous silicon at low temperature", J. Appl. Phys. 79(10), pp. 7529–7536, May 15, 1996.
C. Hayzelden, et al. "Silicide formation and silicide–mediated crystallization of nickel–implanted amorphous silicon thin films", J. Appl. Phys. 73(12), pp. 8279–8289, Jun. 15, 1993.
C. Hayzelden, et al. "In situ transmission electron microscopy studies of silicide–mediated crystallization of amorphous silicon", Appl. Phys. Lett. 60(2), pp. 225–227, Jan. 13, 1992.
B.D. Cullity, "Elements of X–ray diffraction", $2^{nd}$ Ed. (Addison Wesley, Massachusetts, 1978), pp. 281–323.
R.C. Cammarata, et al. "Silicide precipitation and silicon crystallization in nickel implanted amorphous silicon thin films", J. Mater, Res. vol. 5, No. 10, pp. 2133–2138, Oct. 1990.

* cited by examiner

*Primary Examiner*—Robert Kunemund

(57) ABSTRACT

A method for crystallizing an amorphous layer into a polycrystalline layer. The method uses a substrate under the amorphous layer and a nickel film on the amorphous layer, which are subjected to a heat treatment. The nickel film is formed by a coating step that uses a nickel-containing solution. Alternatively, a nickel and gold, or a nickel and palladium, solution can be used. The method eliminates contamination with metal in the polycrystalline silicon layer and reduces its growth temperature.

17 Claims, 15 Drawing Sheets

FIG. 8A
FIG. 8B
FIG. 8C
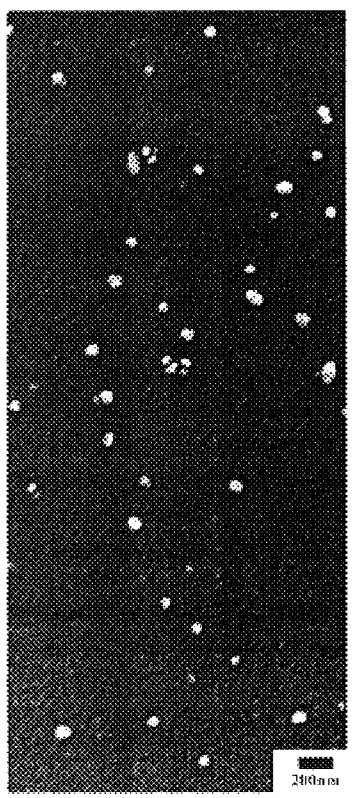
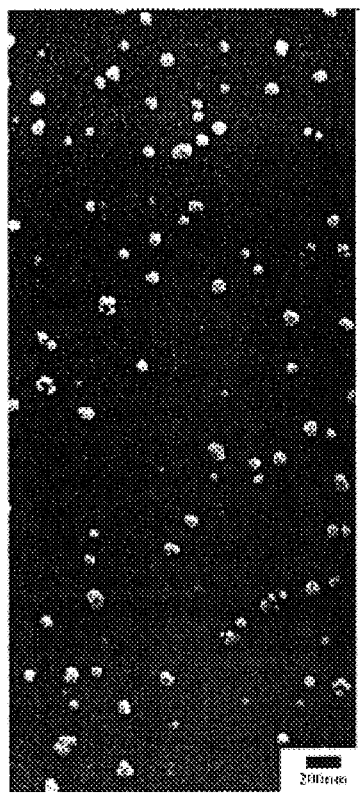
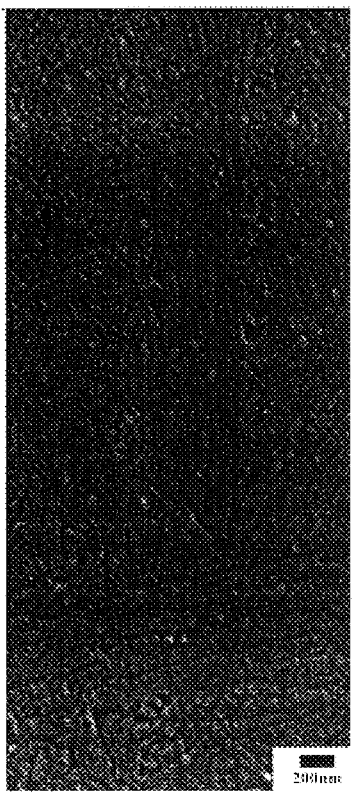
470°C
500°C
530°C

FIG. 10A
FIG. 10B
(a)
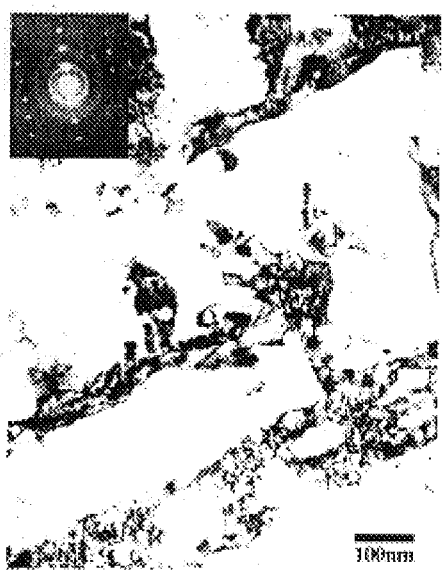
(b)

FIG. 14A
FIG. 14B
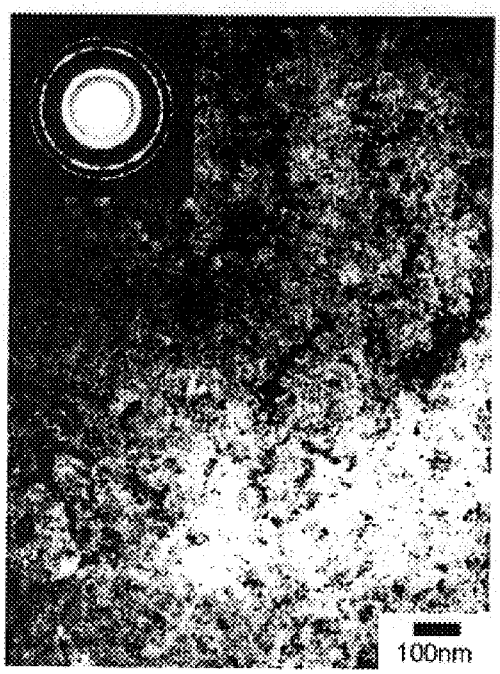
100nm
(a)
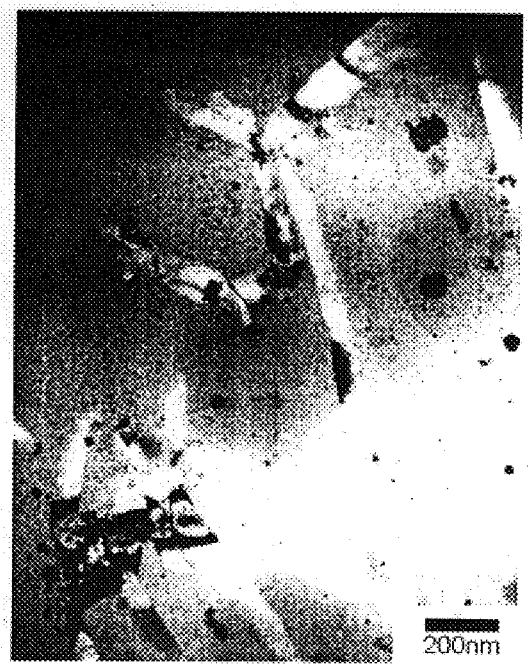
200nm
(b)

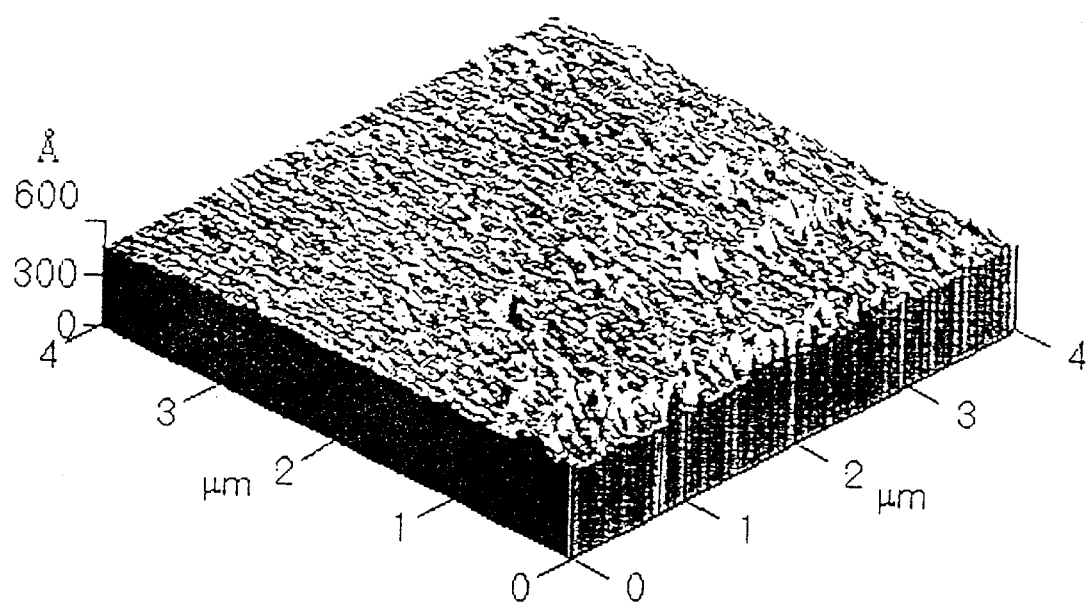

METHOD FOR CRYSTALLIZING AMORPHOUS LAYER

BACKGROUND OF THE INVENTION

1. Field of the Invention

The present invention generally relates to a method for crystallizing amorphous layer. More particularly, the present invention relates to a method for crystallizing amorphous layer wherein the amorphous layer is coated with a nickel-containing solution and heated afterwards.

2. Discussion of Related Art

Polysilicon layer has been employed for the active layer of a thin film transistor in semiconductor devices, notably liquid crystal display devices. This is because the polysilicon layer has a high carrier mobility relative to amorphous silicon layer. Such polysilicon is normally grown at high temperatures. However, there have been recently developed techniques for fabrication of polysilicon thin film transistors at low temperatures.

This low-temperature polysilicon involves some advantages in that it can be processed at low temperatures, can form large areas and can perform comparably to high formation-temperature polysilicon.

Many techniques are known for crystallization of amorphous silicon layer, such as SPC (Solid Phase Crystallization), laser crystallization and so forth. Laser crystallization is a technique wherein amorphous silicon layer is subjected to a heat treatment making use of a laser for crystallization at low temperatures, i.e. less than 400° C. (see Hiroyaki Kuriyama et al., Jpn, J. Phys. 31, 4550 (1992)). Laser crystallization, however, is not useful for the purpose of formation of polysilicon layer on a substrate which is large in area, because the polysilicon layer in this case is not formed uniformly and costs a great deal due to the use of expensive equipment for which the yields are low.

In the SPC technique, amorphous silicon layer is heated in the 550° to 700° C. range of temperature for about 1–24 hours. This has the advantage that the amorphous silicon layer crystallizes uniformly with inexpensive equipment. However, it is inapplicable to a glass substrate since the layer crystallizes at relatively high temperatures only after a long time, plus the yields are low.

Metal-induced crystallization is another example of a method for crystallizing amorphous silicon at low temperatures (See S. Haque et al., Appl. Phys. 79, 7529 (1996)). In metal-induced crystallization, amorphous silicon is brought into contact with a specified kind of metal in order to lower the crystallization temperature. For example, in a nickel-induced crystallization, the final nickel silicide phase, $NiSi_2$, acts as a crystal seed that promotes polycrystalline silicon growth (see C. Hayzelden et al., J. Appl. Phys. 73, 8279 (1993)). Nickel silicide $NiSi_2$ has a silicon-like structure with a lattice constant of 5.405 Å, approximate to that of silicon (5.340 Å), and accelerates the change of amorphous silicon into poly silicon (See C. Hayzelden et al., Appl. Phys. Lett. 60, 225 (1992)). When metal-induced crystallization is applied to a prior art, metal solid layer having a certain thickness is deposited on amorphous silicon layer by sputtering technique. And then, the amorphous silicon layer having metal solid layer thereon is subjected to a heat treatment.

The period of time and temperature of the heat treatment as well as the amount of metal used can affect metal-induced crystallization. For example, crystallization temperature becomes lowered with an increase in the amount of metal. For the metal-induced crystallization described above, amorphous layer crystallizes at low temperatures with growth efficiency increasing in proportion to the amount of metal. Metal functions as catalyst for crystallizing the amorphous layer.

However, an example of the problem with such a metal-induced crystallization of amorphous silicon lies in the change of inherent properties of the silicon layer that results from contaminant metals entering the polysilicon layer. Furthermore, heat treatment takes a long time i.e. 10 hours or more, and the growth temperature is relatively high.

Despite the metal-induced crystallization being attainable at low temperatures, the natural properties of silicon layer may be changed by the presence of contaminating metals. An increase in the amount of metal substantially increases the efficiency of metal-induced crystallization, but also raises the problem of metal-contamination. It is therefore desirable to reduce metal-contamination of silicon layer due to the metal-induced crystallization as well as to lower the crystallization temperature.

SUMMARY OF THE INVENTION

Accordingly, the objectives of the present invention are to solve the problem described above and create a method for crystallizing an amorphous layer into a polycrystalline layer which is adapted to a metal-induced crystallization that decreases metallic contamination by coating the amorphous silicon layer with a nickel-containing solution and subsequently carrying out a heat treatment.

The nickel-containing solution may include another metal such as Au or Pd, which results in the further reduction of crystallization temperature. The present invention in this case is especially applicable to the crystallization of an amorphous layer of silicon such as amorphous silicon.

In the crystallization of an amorphous layer through a metal-induced crystallization, the amorphous layer is coated with a nickel-containing solution (such as a nickel solution or a mixed solution prepared by adding another metal to the nickel solution) and subjected to a heat treatment in order to lower the crystallization temperature and prevent the layer from being contaminated with metal.

The present invention provides a method for crystallizing an amorphous layer into a polycrystalline layer, the method for comprising the steps of: providing an amorphous layer and a nickel-containing seed film on a substrate structure; said nickel-containing seed film being formed by coating a surface of said amorphous layer or said substrate with a nickel-containing solution; and heating said amorphous layer and said nickel-containing seed film to convert said amorphous layer into a polycrystalline layer at a lower temperature than if said seed film were not present.

In more detail, the present invention provides a method for crystallizing an amorphous layer including the steps of: forming an amorphous layer on an insulating substrate such as quartz, glass or oxide layer; coating the amorphous layer with a nickel-containing solution by a spin coating or dipping technique; and carrying out a heat treatment in the 3000 to 8000° C. range of temperature in vacuum or under the nitrogen atmosphere.

The nickel-containing solution may be a nickel solution prepared by dissolving nickel in a specified solvent, or a mixed solution prepared by adding another metal to the nickel solution dissolved in a specified solvent or by mixing the nickel solution with the metal solution where another metal is dissolved.

It is to be understood that both the foregoing general description and the following detailed description are exemplary and explanatory, and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

In the drawings:

FIGS. 8A, 8B and 8C show SEM (Scanning Electron Microscopy) images of the polysilicon layer obtained at different temperatures of heat treatment in accordance with the first preferred embodiment of the present invention;

FIGS. 10A and 10B are TEN images of the polysilicon layer obtained after 20 hours of heat treatment at 500° C. with a 10,000 ppm nickel solution in accordance with the first preferred embodiment of the present invention;

FIGS. 14A and 14B are TEN images dependent on the annealing temperature of the polysilicon layer obtained in accordance with the second preferred embodiment of the present invention;

FIG. 16 is an AFM image of the polysilicon prepared in accordance with the second preferred embodiment of the present invention.

DETAILED DESCRIPTION OF PREFERRED EMBODIMENT

Figure 1A:
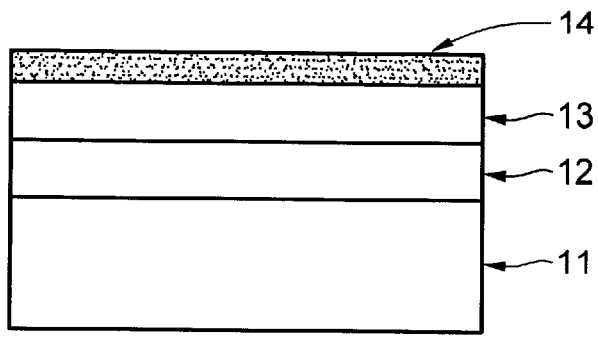
FIGS. 1A, 1B and 1C illustrate three examples of the position at which amorphous silicon layer and nickel film are formed on a substrate in accordance with a first preferred embodiment of the present invention.
Figure 1B:
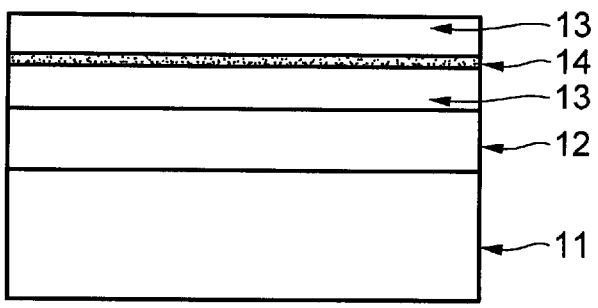
Figure 1C:
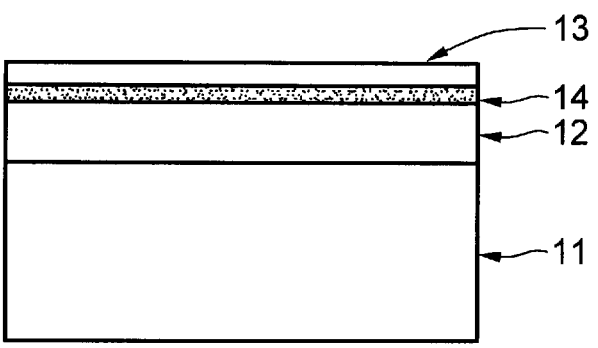

FIGS. 1A–1C illustrate three examples of crystallization of amorphous silicon making use of a nickel solution in accordance with a first preferred embodiment of the present invention. The nickel solution is prepared by dissolving nickel in acid solution, such as nitric solution or hydrochloric solution. In cross section of the respective substrates in the following embodiments, amorphous silicon layer is formed in the 100 to 10,000 Å range of thickness and nickel film is around 0.1 to 100 Å thick.

As shown in FIG. 1A, amorphous silicon layer 13 is first formed on an insulating substrate 11 and then coated with a nickel solution, forming a nickel film 14. The insulating substrate 11 is preferably normally made of quartz, glass or an oxide layer. A buffer layer 12 may be interposed between the insulating substrate 11 and the amorphous silicon layer 13 in order to prevent impurities of the insulating substrate 11 from entering the amorphous silicon layer 13 during the crystallization of amorphous silicon. Customarily, the buffer layer is an oxide insulating layer.

As shown in FIG. 1B, there are sequentially formed a buffer layer 12 and an amorphous silicon layer 13 on an insulating substrate 11. Nickel film 14 is then formed by the spin coating technique or dipping technique, and a second amorphous silicon layer 13 is formed over the nickel film 14.

As shown in FIG. 1C, following formation of a buffer layer 12 on an insulating substrate 11, nickel film 14 is formed by the spin coating technique or dipping technique, and amorphous silicon layer 13 is formed on the nickel film 14. Amorphous silicon layer 13 and nickel film 14 in this figure are diametrically opposed in position to those shown in FIG. 1A.

Such the substrates are subjected to a heat treatment in a range of 300 to 800° C. range in a vacuum or under the nitrogen atmosphere, permitting the crystallization of amorphous silicon.

Coating with a nickel solution may be carried out by the spin coating or dipping technique. The spin coating technique is well known in the art and, for the sake of brevity, will not be described in greater detail.

The following is a description of the coating process using a dipping technique, which is normally adapted to prepare a specimen of large area.

After heating a metal solution or a specimen and bringing the specimen into contact with the metal solution for a required period of time such that the specimen adsorbs metal, the specimen is washed with D.I. (deionized) water to remove the moisture containing residual nitrogen and subjected to a heat treatment and crystallization. It is possible to regulate the amount of metal adsorbed by varying the concentration of metal solution, temperature and period of time that the dipping technique is carried out.

Figure 2:
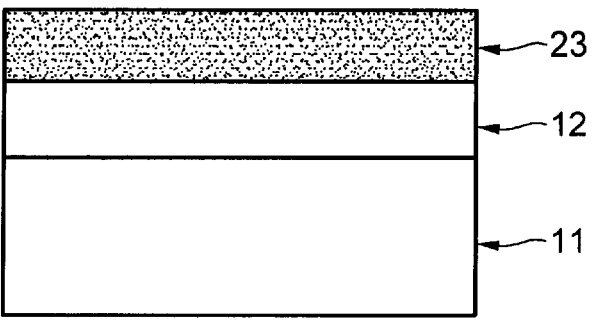
FIG. 2 is a diagram illustrating the results of the first preferred embodiment as shown in FIG. 1.

FIG. 2 illustrates polysilicon layer in cross section. FIG.2 reflects the respective substrates shown in FIGS. 1A–1C having been subjected to a heat treatment such that the amorphous silicon layer has changed into polysilicon layer. As shown in FIG. 2, a buffer layer 12 overlies an insulating substrate 11. An amorphous silicon layer has been crystallized into polysilicon layer 23 by the metal-induced crystallization. The nickel in the nickel solution functions as catalyst for crystallization of amorphous silicon layer.

Figure 3:
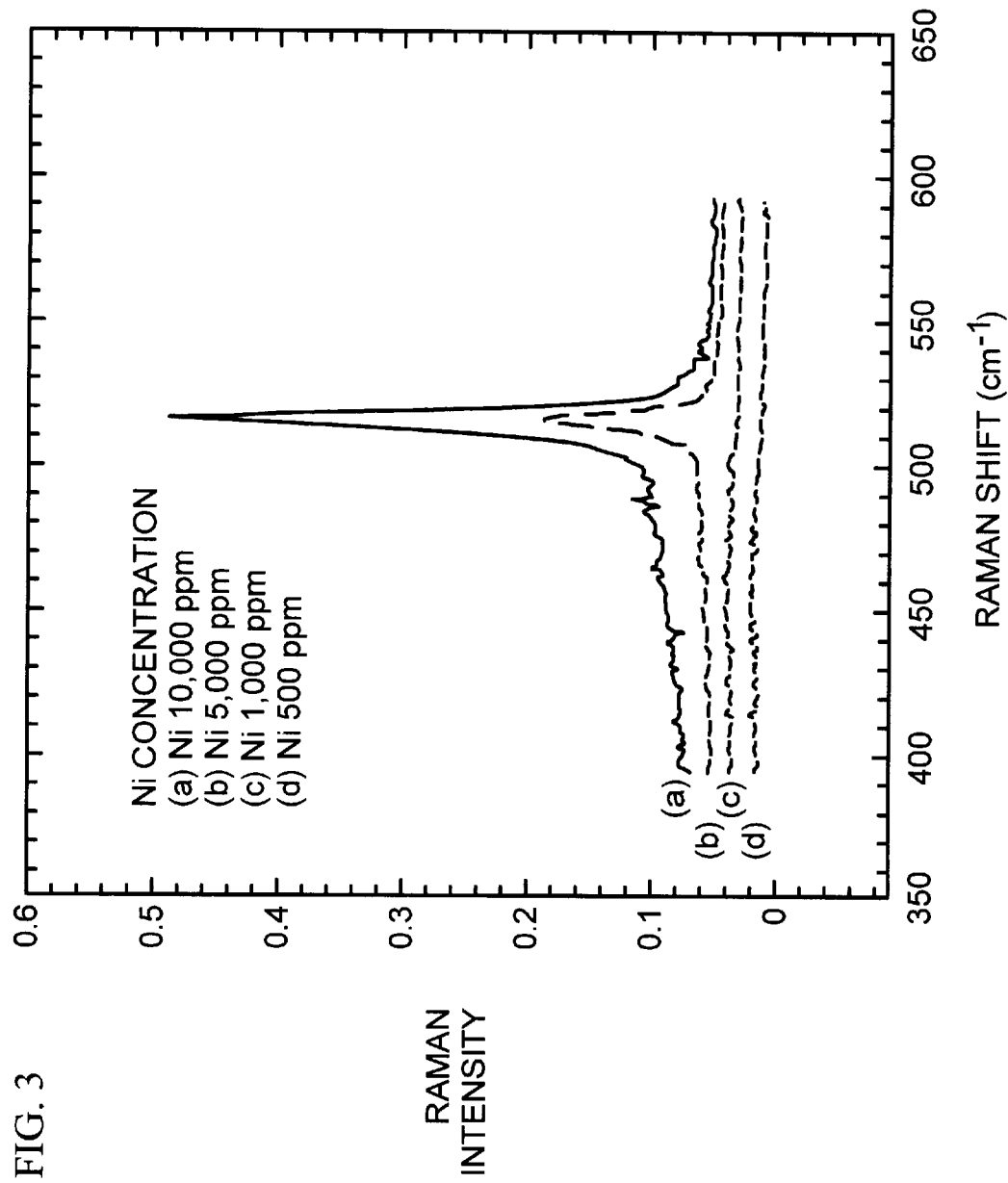
FIG. 3 shows a Raman spectrum demonstrating the effect of the concentration of nickel upon the polysilicon layer obtained in accordance with the first preferred embodiment of the present invention.

FIG. 3 shows the variance of Raman intensity dependent on the concentration of nickel in the nickel solution. This variance of Raman intensity was obtained after 10 hours of heat treatment at 530° C. in accordance with the first preferred embodiment of the present invention. Nickel in this case is dissolved in nitric acid solution or hydrochloric acid solution as described previously.

No peak for polysilicon is observed at the concentration of nickel less than 1,000 ppm. A peak in the Raman intensity develops with an increase in the concentration of nickel to 5,000 ppm. A sharp peak occurs at below 520 cm$^{-1}$ arising from TO (Transverse Optical) or phonon mode, with a broad peak from fine crystals being observed at less than 510 cm$^{-1}$.

Figure 4:
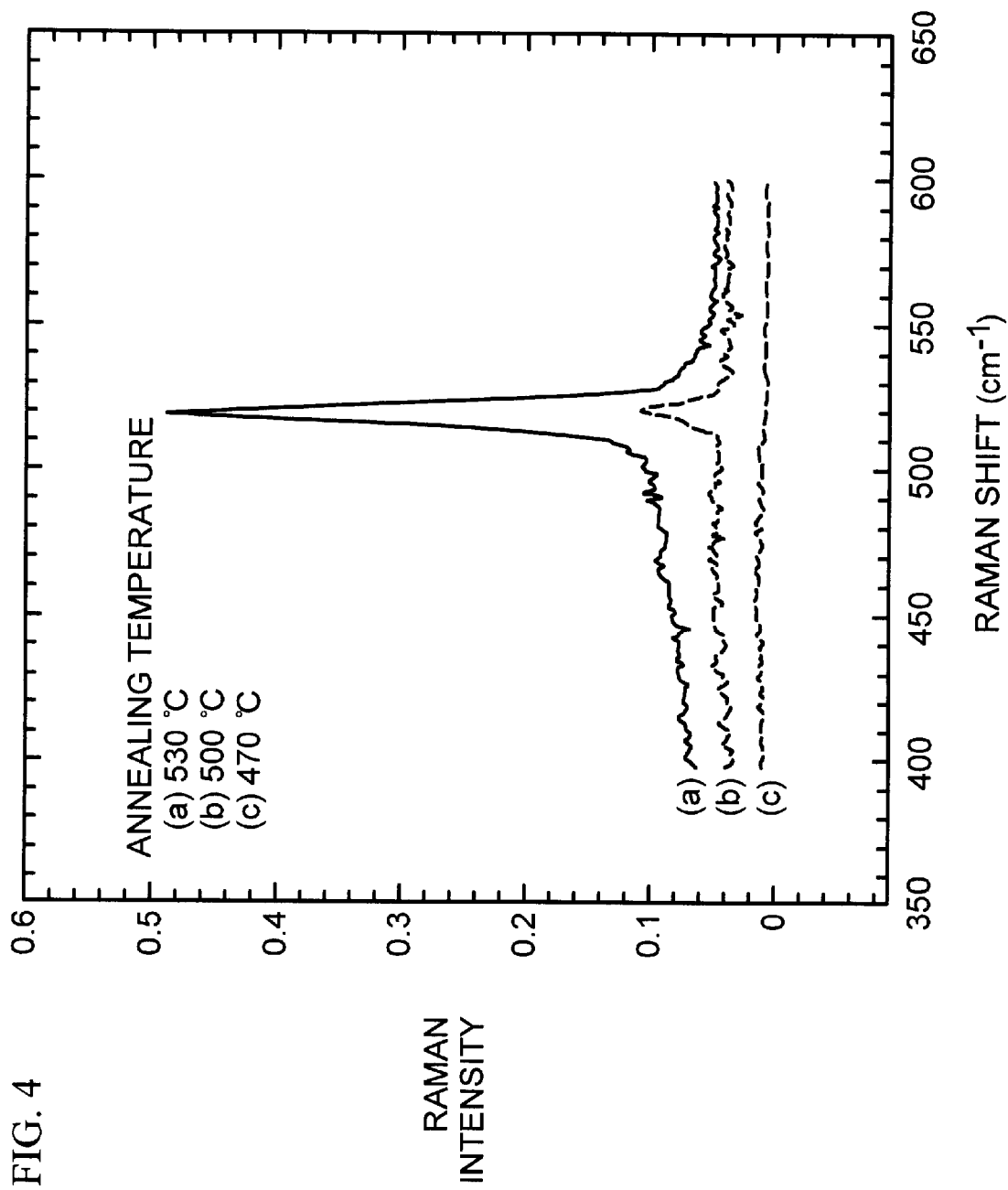
FIG. 4 shows a Raman spectrum demonstrating the effect of the growth temperature upon the polysilicon layer obtained in accordance with the first preferred embodiment of the present invention.

FIG. 4 shows the variance of Raman intensity dependent on the temperature of heat treatment for the polysilicon layer obtained in the first preferred embodiment of the present invention. The concentration of nickel is 10,000 ppm and the heat treatment is carried out for 10 hours.

A small peak for polysilicon appears at the temperature of 500° C. The intensity of that peak increases significantly for heat treatment at the temperature of 530° C.

Figure 5:
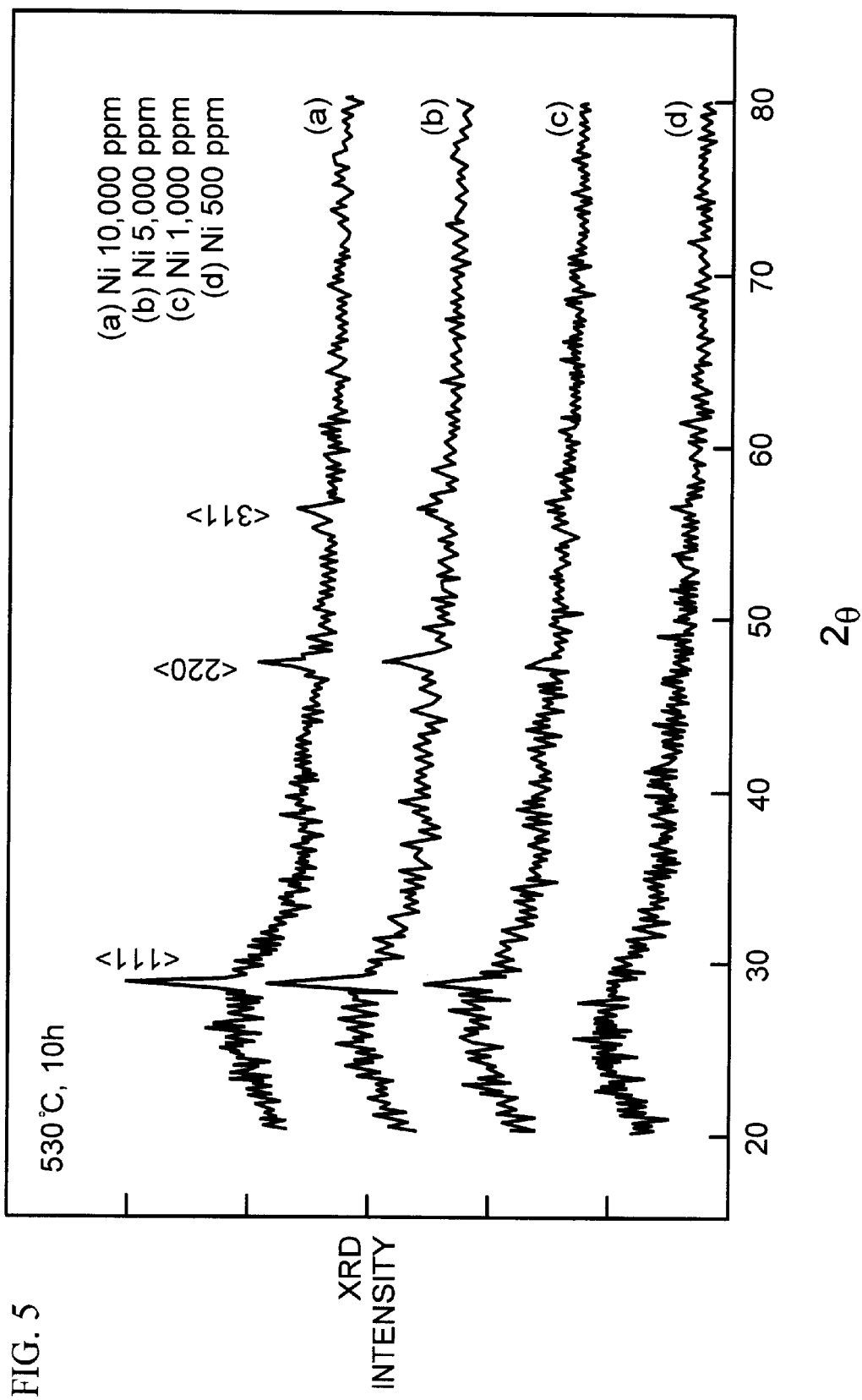
FIG. 5 shows the intensity of X-ray diffraction dependent upon the concentration of nickel in the polysilicon layer obtained in accordance with the first preferred embodiment of the present invention.

FIG. 5 depicts the intensity of X-ray diffraction at different incident angles, dependent upon the concentration of nickel in the polysilicon layer obtained in the first preferred embodiment of the present invention.

No peak arising from polysilicon occurs when the concentration of nickel is 500 ppm. Two peaks can be observed at 1,000 ppm. Beyond 1,000 ppm in concentration, three peaks for polysilicon are observed which lie in the <111> (d=3.14 Å), <220>(d=1.92 Å) and <311>(d=1.64 Å) directions. The intensities of the peaks are increased with an increase in the concentration of nickel. When using a 1,000 ppm nickel solution, weak peaks appear in the <111> and <220> directions but not the <311> direction, and no peak is observed in the Raman scattering plot (see. FIG. 3). It may be thus considered that very fine crystals exist in the polysilicon layer. In conclusion, the use of a 1,000 to 10,000 ppm nickel solution in the coating technique induces the growth of crystals of a specified particulate size.

Figure 6:
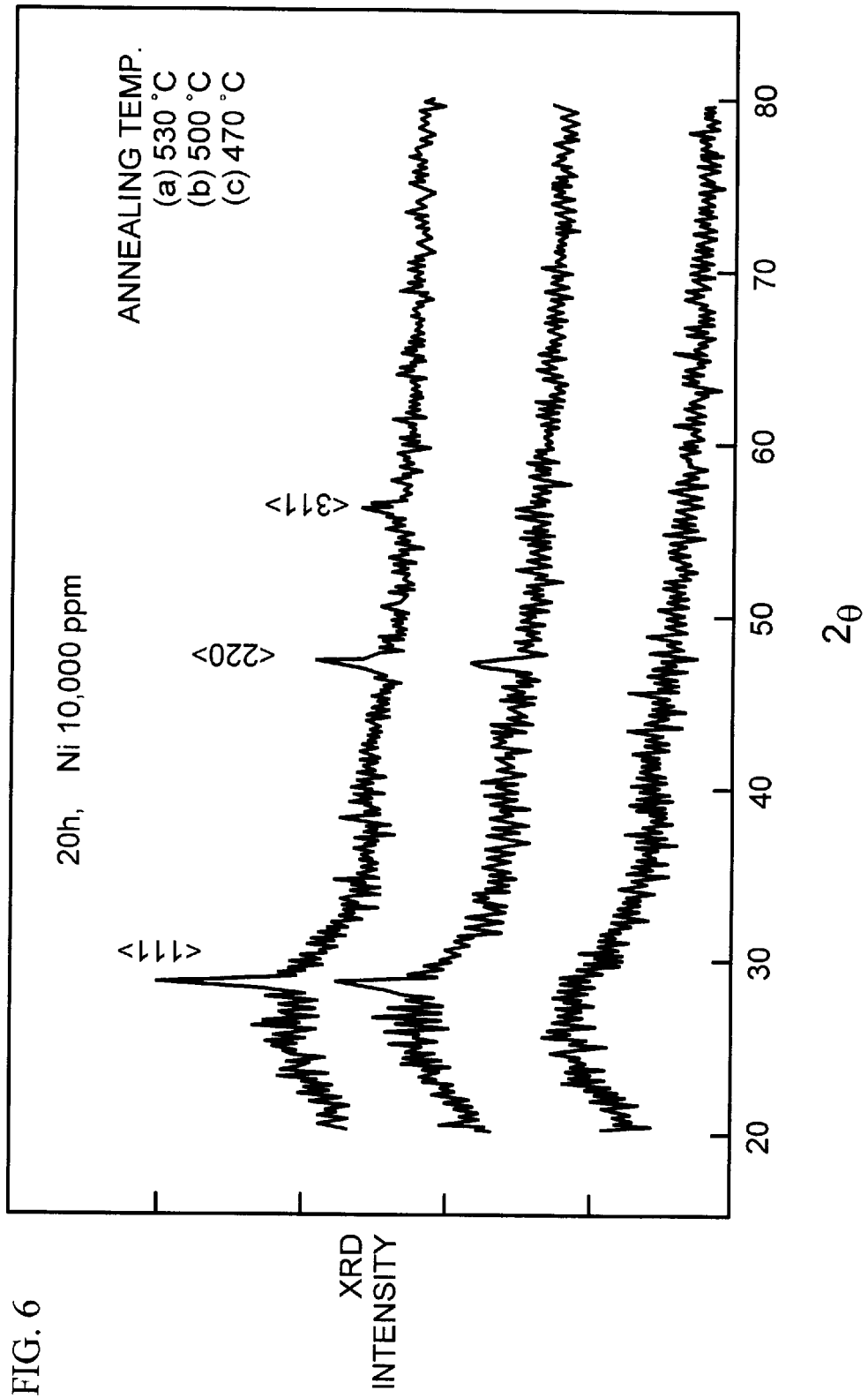
FIG. 6 shows the intensity of X-ray diffraction dependent upon the temperature of heat treatment for the polysilicon layer obtained in accordance with the first preferred embodiment of the present invention.

FIG. 6 shows the intensity of X-ray diffraction at different incident angles dependent upon the temperature of heat treatment for the polysilicon layer obtained in the first preferred embodiment of the present invention.

At a temperature greater than 500° C., three peaks for polysilicon appear in the <111>(d=3.14 Å), <220>(d=1.92 Å) and <311>(d=1.64 Å) directions. The intensities of the peaks increase with an increase in the temperature of the heat treatment.

Figure 7:
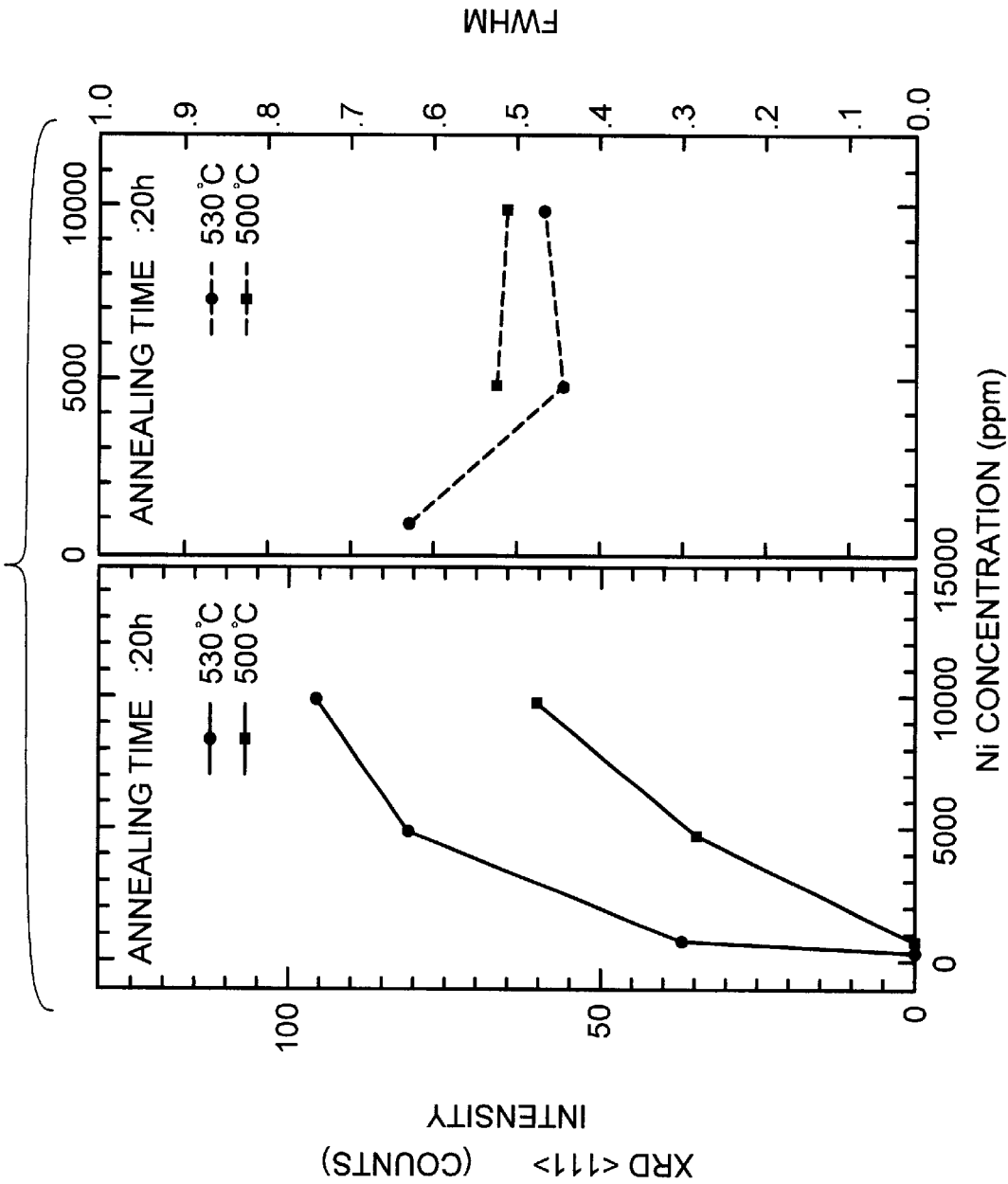
FIG. 7 shows the peak intensity in the <111> direction and FWHM (Full Width at Half Maximum) for crystal dependent upon the concentration of nickel in the polysilicon layer obtained in accordance with the first preferred embodiment of the present invention.
Figure 9A:
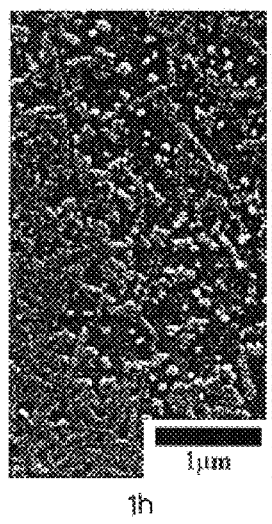
FIGS. 9A, 9B, 9C and 9D show SEN images of the polysilicon layer obtained with different periods of time for heat treatment in accordance with the first preferred embodiment of the present invention.
Figure 9B:
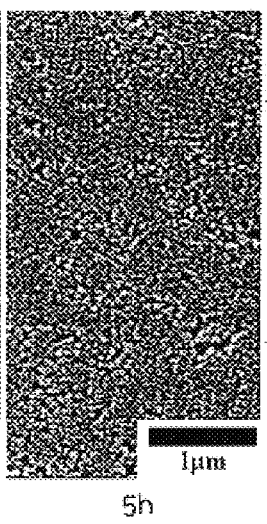
Figure 9C:
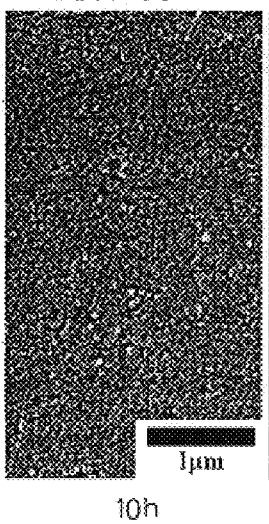
Figure 9D:
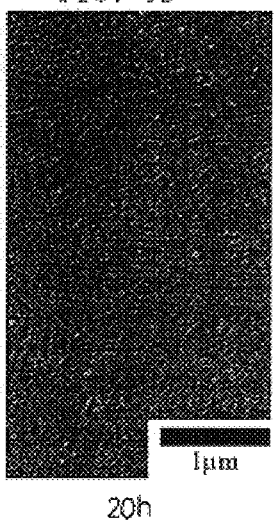

FIG. 7 shows the peak intensity in the <111> direction and FWHM (Full Width at Half Maximum) of polysilicon crystal to be dependent upon the concentration of nickel in the first preferred embodiment of the present invention.

As shown in FIG. 7, the intensity of the <111> peak increases with an increase in the concentration of nickel and the temperature of heat treatment. As the nickel concentration increases at for the 530° C. heat treatment, the FWHM of the <111> peak proportionately decreases somewhat and becomes substantially constant.

The Scherrer reference (also see B. D. Cullity, "Elements of X-ray Diffusion". 2nd Ed, (Addison Wesley, Massachusetts, 1978), P.281) defines the relationship between the crystal size and the FWHM for polysilicon as follows:

$$t=0.9/(\lambda(B \text{ cosine } \theta))$$

Where t is the crystal size, X is the wavelength of the X-ray and B is the FWHM of the peak arising from X-rays. According to Scherrer's expression, the crystal size is inversely proportional to the FWHM. Thus, the crystal size for polysilicon layer is decreased and becomes substantially constant with an increase in the concentration of nickel.

FIGS. 8A–8C show SEM (Scanning Electron Microscopy) images of the polysilicon layer obtained at different temperatures of heat treatment in accordance with the first preferred embodiment of the present invention.

At 470° C., the layer is almost amorphous silicon and contains 1000 angstrom crystals in low density. These crystals are of the NiSi$_2$ phase (See R. C. Cammarata et al., J. Matter, Res. 5, 2133 (1990)). As the temperature of the heat treatment rises, the concentration of crystal increase in the thin layer such that the layer crystallizes. At 530° C., a sufficient concentration of long linear crystals are observed such that the layer can be characterized as a polysilicon thin layer.

FIGS. 9A–9D show SEM images of the polysilicon layer obtained after different lengths of heat treatment in accordance with the first preferred embodiment of the present invention. The concentration of nickel in this case is 10,000 ppm and the heat treatment is carried out at 530° C.

As the length of the heat treatment increases, the crystals in the thin layer are grown such that amorphous silicon almost crystallizes to polysilicon in about 10 hours. A specimen that has been subjected to about 1 hour of heat treatment contains a both polysilicon and amorphous silicon phases.

FIGS. 10A and 10B are transmission electron microscopy (TEM) images of the polysilicon layer obtained after 20 hours of heat treatment at 500° C. with a 10,000 ppm nickel solution in accordance with the first preferred embodiment of the present invention.

As seen from the figures, bar-shaped crystals are grown to form a 5 to 20 micron network. These bar-shaped crystals are less than 1,500 angstroms in width and grow to be several micrometers long. Two or more light and dark crystal phases are overlapped as shown in the images, which results from the difference in the diffraction of the crystals.

The Cammarata reference mentioned above (also see C. Hayzelden et al., Phys. Lett. 660, 225 (1992)) indicates that the nickel-induced crystallization takes place as the NiSi$_2$ phase moves from the crystalline region to amorphous region. That is, bar-shaped crystals keep growing with NiSi$_2$ migrating from the ends of monocrystal to the amorphous region. As regards the monocrystal (i.e., polysilicon) growth in amorphous silicon, the crystal direction of Si depends on the <111> plane of the initial NiSi$_2$. However, the crystals in the thin layer all grow in the <111> direction (C. Hayzelder et al., J. Appl. Phys. 73, 8279 (1993)). That is, bar-shaped crystals never grow in the <111> direction according to the migration of NiSi$_2$ unless a plane perpendicular to the NiSi$_2$ <111> direction exists on the plane of the thin layer.

FIG. 10B shows the middle part and electronic diffraction pattern of the TEM image shown in FIG. 10A. As shown in FIG. 10B, crystals are substantially grown in the bar form and amorphous regions lie among the bar-shaped crystals. This result is analogously observed in the metal-induced crystallization of ion-implanted amorphous silicon, while not in the polysilicon layer obtained from the nickel-induced crystallization arising from nickel deposition. As for the polysilicon layer obtained by nickel deposition, for example, crystals grow from numerous $NiSi_2$ phases throughout the thin layer very rapidly such that bar-shaped crystals are not formed in the layer. Such a formation of bar-shaped crystals is observed in the SEM images of FIGS. 8C and 9D, which show that the formation of bar-shaped crystals leads to crystallization the thin layer.

Figure 11:
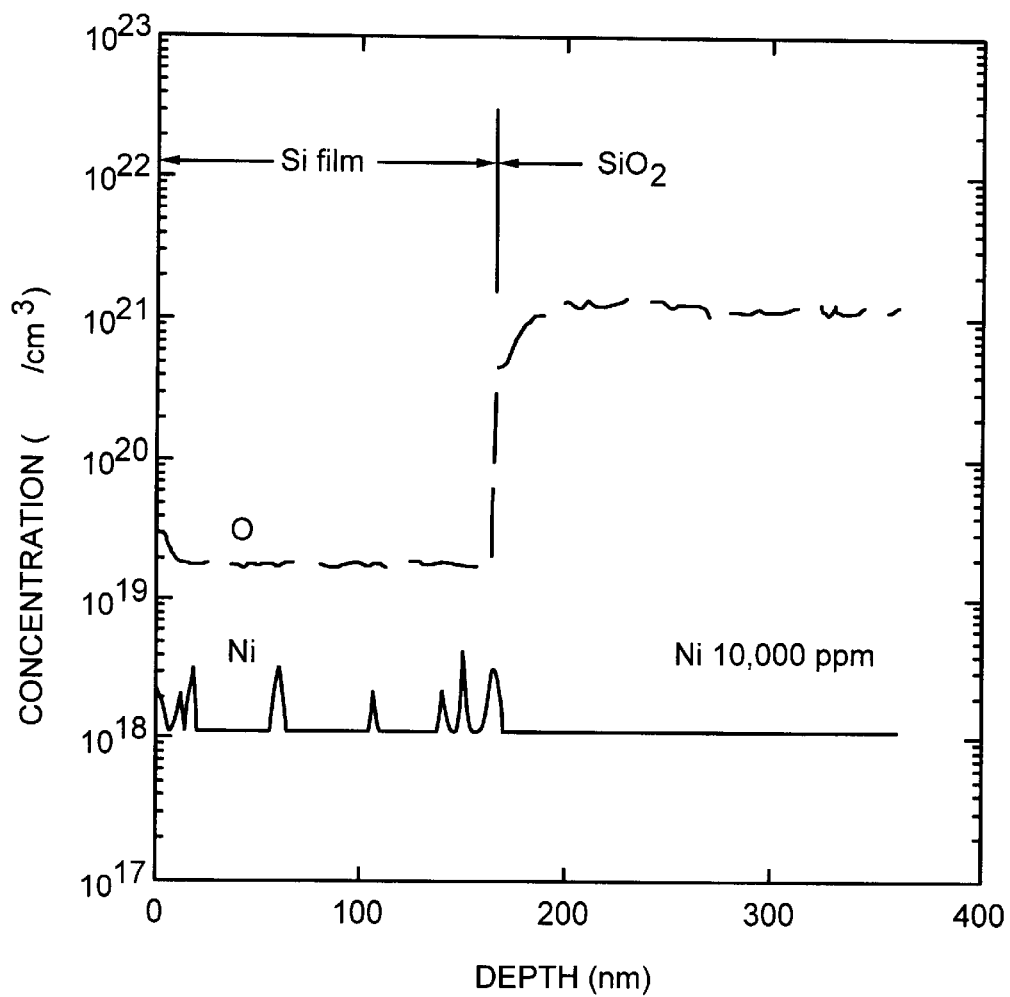
FIG. 11 shows the variance of concentration of nickel depending on the depth of the polysilicon layer obtained after 10 hours of heat treatment at 500° C. in accordance with the first preferred embodiment of the present invention.

FIG. 11 shows a variance in the concentration of nickel depending on the depth of the polysilicon layer obtained after 10 hours of heat treatment at 500° C. in accordance with the first preferred embodiment of the present invention.

In this case, the concentration of nickel is $1.2 \times 10^8/cm^3$, which is much less than in the polysilicon layer obtained by depositing nickel on an amorphous silicon layer in a sputtering apparatus. Nickel existing at the interface between the polysilicon and the glass substrate results from the migration of $NiSi_2$ silicide phase.

The aforementioned embodiment is exemplary for the present invention wherein the amorphous silicon crystallizes after an amorphous silicon layer is coated with a nickel solution.

According to the present invention, an addition of other metals to the nickel solution permits the amorphous layer to crystallize into polysilicon. The crystallization temperature in this case can be lowered relative to the case of crystallization using only a nickel solution in the first embodiment of the present invention. The following embodiment involves the crystallization of an amorphous silicon layer coated with a solution of a nickel and metal mixture for example, nickel and gold mixture (nickel-gold mixture solution). To induce the crystallization of amorphous silicon layer, the first embodiment uses a nickel solution. The nickel solution is prepared by dissolving nickel in acid solution. In the second embodiment of the present invention, a nickel-metal mixture solution is prepared by admixing a nickel solution dissolved in a solvent with a metal solution. The metal solution may contain Au or Pd dissolved in a solvent. The solvent is an acid solution. The acid solution is a nitric acid solution or a hydrochloric acid solution.

Three examples of crystallization of amorphous silicon coated with a nickel-gold mixture solution according to a second preferred embodiment of the present invention are analogous to those shown in FIGS. 1A–1C and the result is given as shown in FIG. 2.

After a nickel-gold mixture film and an amorphous silicon layer (in FIG. 1A), an amorphous silicon layer, a nickel-gold mixture film and an amorphous silicon layer (in FIG. 1B), or an amorphous silicon layer and a nickel-gold mixture film (in FIG. 1C), respectively, are formed on an insulating layer. The amorphous silicon undergoes crystallization induced by the nickel and gold. The crystallization and formation of each of the layers in the second preferred embodiment of the present invention is analogous to the first embodiment with the exception that a nickel-gold mixture solution is used instead of a nickel-only solution, and further discussion will be omitted for the sake of brevity.

Figure 12:
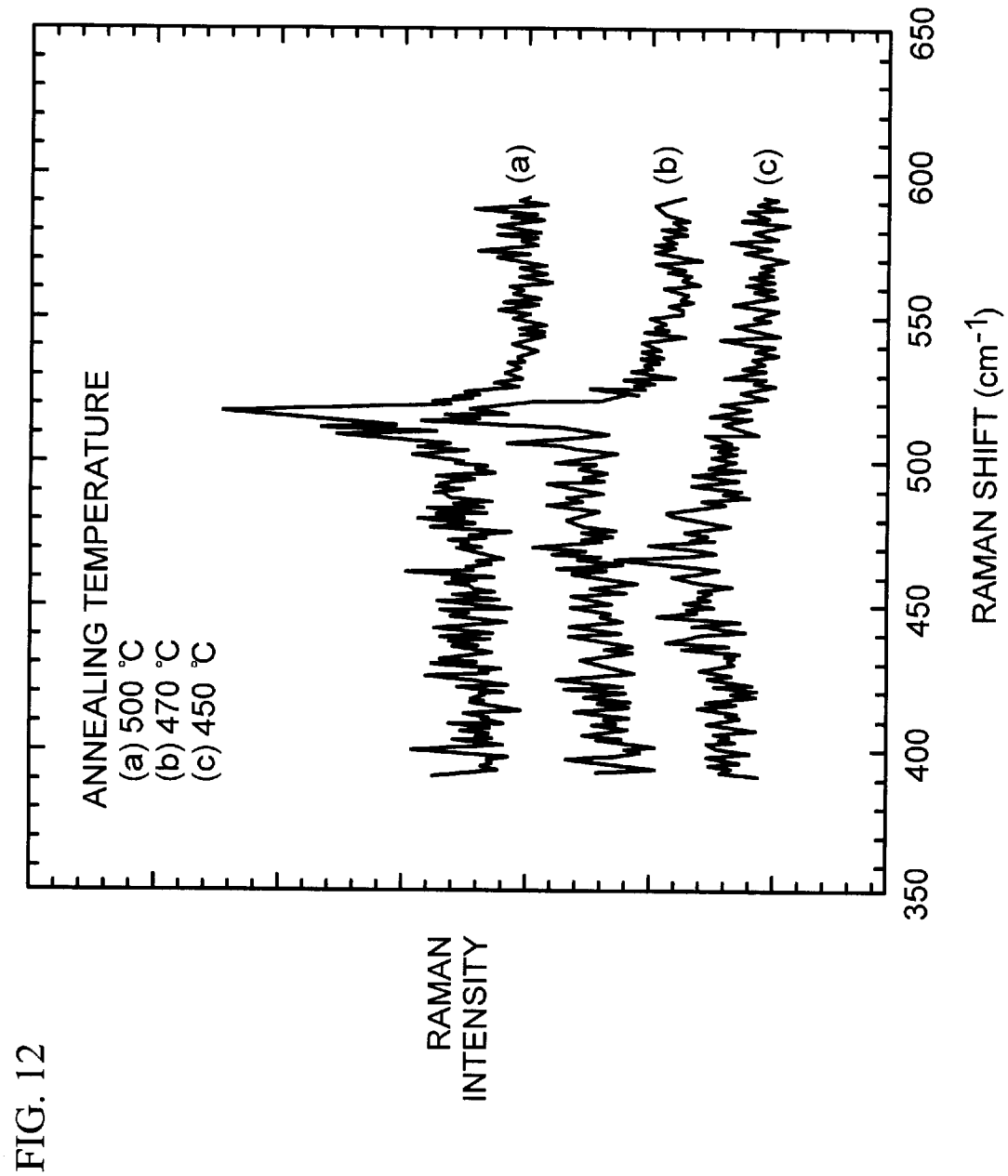
FIG. 12 shows the variance of Raman intensity dependent on the annealing temperature of the polysilicon layer obtained in accordance with a second preferred embodiment of the present invention.

FIG. 12 shows the variance of Raman intensity, which is dependent on the temperature of the heat treatment, for the polysilicon film obtained in accordance with the second preferred embodiment of the present invention. In FIG. 12, wherein a mixture solution containing 2,500 ppm nickel and 500 ppm gold is used and the heat treatment is carried out for 20 hours.

A sharp peak occurs at about 520 $cm^{-1}$ arising from TO (Transverse Optical) or phonon mode at the temperature of 470° C. or greater, while no peak for crystals appears at 450° C. Accordingly, it may be said that the crystallization temperature can be lowered more effectively when the nickel-gold mixture solution is used to induce the crystallization of amorphous silicon than when a nickel-only solution is used as in the first embodiment of the present invention. In this embodiment, gold as well as nickel functions as catalysts for crystallizing of the amorphous silicon layer.

Figure 13:
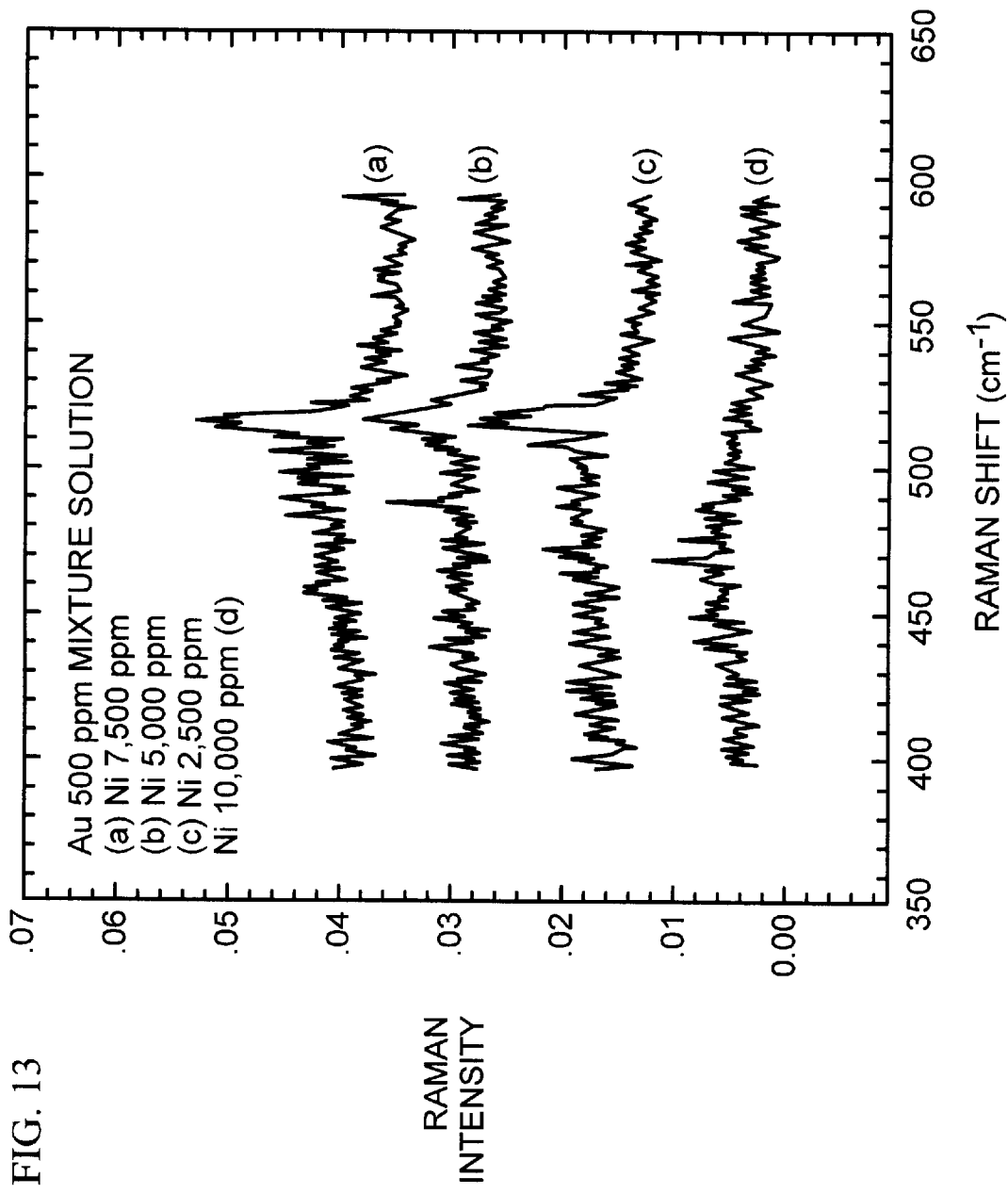
FIG. 13 shows the variance of Raman intensity dependent on the concentration ratio of nickel and gold in the polysilicon layer obtained in accordance with the second preferred embodiment of the present invention.

FIG. 13 shows the variance of Raman intensity dependent on the concentrations of nickel and gold in the polysilicon layer obtained in accordance with the second preferred embodiment of the present invention. In FIG. 13, the concentration of gold is fixed to 500 ppm with various concentrations of nickel. In this case, the heat treatment is carried out at 470° C. for 20 hours.

A significant peak for crystals appears when a 500 ppm gold solution is added to the nickel solution. The intensity of the peak does not vary greatly as the concentration of nickel decreases from 7,500 ppm to 2,500 ppm. In case only a 10,000 ppm nickel solution is used without addition of gold in order to verify the function of gold in crystallization, no peak arising from crystals occurs, which demonstrates that the addition of gold promotes the polycrystalline silicon thin layer crystallization.

FIGS. 14A and 14B are TEM images of the polysilicon layer obtained after 20 hours of heat treatment at different temperatures making use of a nickel-gold mixture solution prepared according to the second preferred embodiment of the present invention. In FIGS. 14A and 14B, the solution contains 2,500 ppm nickel and 500 ppm gold.

As shown in FIG. 14A, an electronic diffraction pattern for polysilicon is observed clearly without an electronic diffraction pattern arising from the amorphous silicon. The entire thin layer crystallizes after a heat treatment at 470° C. FIG. 14B shows bar-shaped crystals after a heat treatment at 450° C., wherein crystals about 1,500 angstroms in width and several micrometers long are grown as a result of the migration of $NiSi_2$.

The Cammarata reference mentioned above (C. Hayzelden et al., Phys. Lett. 660, 225 (1992)) indicates that the nickel-induced crystallization takes place as the $NiSi_2$ phase moves from crystalline region to amorphous region.

The crystal direction of Si depends on the <111> plane of the initial $NiSi_2$. However, the crystals in the thin layer all grow in the <111> direction (see C. Hayzelder et al., J. Appl. Phys. 73, 8279 (1993)). That is, bar-shaped crystals grow in the <111> direction according to the migration of $NiSi_2$.

Figure 15A:
FIGS. 15A, 15B and 15C are TEM images dependent on the concentration ratio of nickel and gold in the polysilicon layer obtained in accordance with the second preferred embodiment of the present invention.
Figure 15B:
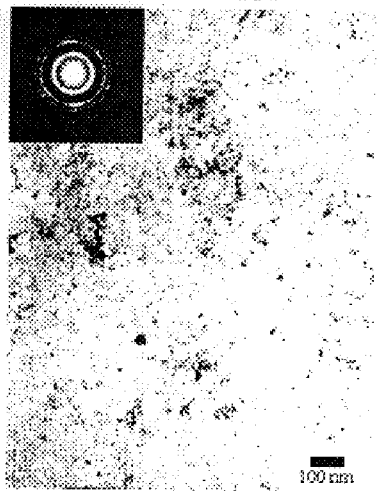
Figure 15C:
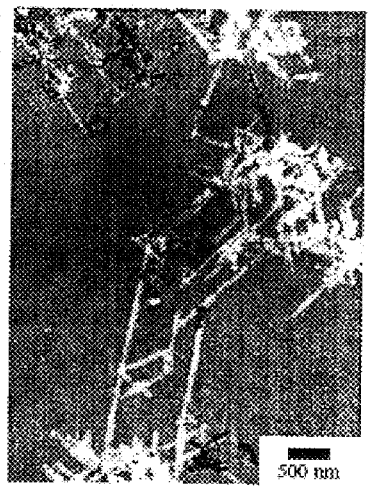

FIGS. 15A–15C are TEM images of the polysilicon layer obtained after 20 hours of heat treatment at 470° C. and having made use of a nickel-gold mixture solution according to the second preferred embodiment of the present invention.

FIG. 15A is a TEM image of the polysilicon layer obtained with only a 10,000 ppm nickel solution, wherein much of the uncrystallized amorphous region exists and bar-shaped crystals are grown resulting from the migration of $NiSi_2$.

FIGS. 15B and 15C are TEM images showing the electronic diffraction patterns of the polysilicon layers obtained with nickel-gold solutions containing 500 ppm gold and 2,500 ppm and 7,500 ppm nickel, respectively. In case a small amount of gold is added to the nickel solution, the crystal growth is actively achieved by the migration of $NiSi_2$ to complete the crystallization of thin layer at 470° C. but the growth temperature is apparently decreased below 450° C. Adding a small amount of gold to the nickel solution reduces discordance in the crystal sizes of $NiSi_2$ and Si, increasing free energy, and decreasing the surface energy of the interface between nickel silicide and silicon to lower the growth temperature of $NiSi_2$. As a result, the growth temperature due to migration of $NiSi_2$ is lowered such that amorphous silicon crystallizes at low temperatures.

FIG. 16 is an atomic force microscopic (AFM) image of the polysilicon prepared according to the second preferred embodiment of the present invention. In FIG. 16, a nickel-gold mixed solution containing 7500 ppm nickel and 500 ppm gold is used and 20 hours of heat treatment is carried out at 500° C.

The polysilicon layer has an average surface roughness of 16 angstroms and the rms surface roughness of 24 angstroms. The roughness of polysilicon is a very important factor that affects the characteristic of electronic devices in manufacture.

The same principles are applicable to the same field of the art other than as specified in the first and second embodiments of the present invention. For example, the nitric acid used as a solvent in the nickel solution may be replaced with other acids. A plurality of amorphous layer that can crystallize may be used instead of an amorphous silicon layer as discussed above. Further, a mixed solution of nickel and another metal such as palladium Pd, instead of gold (Au), can be used in coating the amorphous layer to be crystallized. In this case, the ratio of nickel and another metal contained in the nickel-metal mixed solution may range in variance for example, from 1 to 100. The present invention is applicable irrespective of the position at which a layer is formed with the nickel-containing solution insofar as the nickel-containing solution is directly brought into contact with the amorphous layer and thereby induces the crystallization of the amorphous layer.

Such as in the present invention as described above, an amorphous layer is coated with a nickel solution and crystallizes through a heat treatment such that the metal-induced crystallization is performed at low temperatures, avoiding contamination with metal in the thin layer. The use of a mixed solution of nickel and another metal permits the growth temperature to be lowered greatly. The result of the present invention may be applicable to the fabrication of a thin film transistor which is a driving device of the liquid crystal display as well as to the fabrication of an SRAM or solar battery.

The invention being thus described, it will be obvious that the same may be varied in many ways. Such variations are not to be regarded as a departure from the spirit and scope of the invention, and all such modifications as would be obvious to one skilled in the art were intended to be included within the scope of the following claims.

What is claimed is:

1. A method for crystallizing an amorphous layer into a polycrystalline layer, the method comprising the steps of:
   providing an amorphous layer and a nickel-containing seed film on a substrate structure;
   said nickel-containing seed film being formed by coating a surface of said amorphous layer or said substrate with a nickel-containing solution, the concentration of nickel in said nickel-containing solution being in the range of between about 10,000 ppm and 100,000 ppm; and
   heating said amorphous layer and said nickel-containing seed film to convert said amorphous layer into a polycrystalline layer at a lower temperature than if said seed film were not present.

2. The method claimed as in claim 1, wherein the nickel-containing solution is prepared by dissolving nickel in a solvent.

3. The method claimed as in claim 2, wherein the solvent is an acid solution.

4. The method claimed as in claims 3, wherein the acid solution is a nitric acid solution.

5. The method claimed as in claim 3, wherein the acid solution is a hydrochloric acid solution.

6. The method claimed as in claim 1, wherein the coating step employs a dipping technique.

7. The method claimed as in claim 1, wherein the coating step employs a spin coating technique.

8. The method as claimed in claim 1, wherein the amorphous layer is formed on the substrate and the nickel-containing seed film is formed on the amorphous layer.

9. The method as claimed in claim 1, where in the nickel-containing seed film is formed on the substrate and the amorphous film is formed on the nickel-containing seed film.

10. The method claimed as in claim 1, wherein the amorphous layer is an amorphous silicon layer.

11. The method claimed as in claim 10, wherein the amorphous layer has a thickness in a range of 10 to 100,000 angstroms.

12. The method claimed as in claim 1, wherein said heating is carried out in a range from 300° to 800° C.

13. The method claimed as in claim 1, wherein the nickel film is about 0.1 to 100 angstroms thick.

14. The method as claimed in claim 1, wherein said substrate includes a buffer layer on an insulating substrate.

15. The method as claimed in claim 14, wherein said substrate includes one of quartz, glass or another oxide.

16. A method for crystallizing an amorphous layer into a polycrystalline layer, the method comprising the steps of:
    forming an amorphous layer on an insulating substrate structure;
    forming a nickel-containing seed film by coating said amorphous layer with a nickel-containing solution, said nickel-containing solution having a nickel concentration between about 10,000 ppm and 100,000 ppm; and
    heating said amorphous layer and said nickel-containing seed film to convert said amorphous layer into a polycrystalline layer at a lower temperature than if said seed film were not present.

17. A method for crystallizing an amorphous layer into a polycrystalline layer, comprising:
    forming a first amorphous layer on a substrate structure;
    coating said amorphous layer with a nickel-containing solution to form a seed film;
    forming a second amorphous layer on said seed film; and
    heating said first and second amorphous layers and said seed film to convert said first and second amorphous layers into a polycrystalline layer at a lower temperature than if said seed film was not present.

* * * * *